United States Patent [19]
Juna et al.
[11] 3,850,770
[45] Nov. 26, 1974

[54] RADIATION CURABLE COMPOSITIONS FROM ACRYLURETHANE RESINS

[75] Inventors: Kiyoshi Juna; Takeo Imai; Hiroyuki Nakayama; Nobuyuki Kita; Kiyohiko Asada; Tetsuo Aihara, all of Hiratsuka, Japan

[73] Assignee: Kansai Paint Co., Ltd., Tokyo, Japan

[22] Filed: Apr. 12, 1973

[21] Appl. No.: 350,400

Related U.S. Application Data

[63] Continuation of Ser. No. 81,136, Oct. 15, 1970, abandoned.

[30] Foreign Application Priority Data

Oct. 24, 1969 Japan .............................. 44-84628

[52] U.S. Cl. .......... 204/159.19, 96/36.3, 96/115 P, 117/93.31, 204/159.12, 204/159.15, 204/159.16, 260/17 R

[51] Int. Cl. ..... B01j 1/10, C08f 29/36, C08g 41/04

[58] Field of Search ..... 204/159.16, 159.23, 159.12, 204/159.15; 260/859 R, 17.4 CL, 17 R

[56] References Cited

UNITED STATES PATENTS

| | | | |
|---|---|---|---|
| 3,297,745 | 1/1967 | Fekete et al. | 260/77.5 AP |
| 3,642,943 | 2/1972 | Noel | 260/859 R |
| 3,719,638 | 3/1973 | Huemmer et al. | 260/859 |
| 3,749,592 | 7/1973 | Gaske et al. | 204/159.12 |

*Primary Examiner*—Murray Tillman
*Assistant Examiner*—Thurman Kennis Page
*Attorney, Agent, or Firm*—Ostrolenk, Faber, Gerb & Soffen

[57] ABSTRACT

Photopolymerizable compositions comprise (1) 40 to 80% by weight of unsaturated acrylurethane resin prepared by reacting a diisocyanate monomer with polyhydric alcohols, and then reacting said reaction product with a polymerizable acrylate ester or methacrylate ester having a hydroxyl group, (2) 60 to 20% by weight of a polymer which is compatible with said unsaturated acrylurethane resin and is soluble in dilute aqueous alkali solutions or alcohols, and (3) a photosensitizer which is capable of hardening said unsaturated acrylurethane resin under irradiation of actinic rays.

7 Claims, No Drawings

RADIATION CURABLE COMPOSITIONS FROM ACRYLURETHANE RESINS

This is a continuation of application Ser. No. 81,136 filed on Oct. 15, 1970, now abandoned.

This invention relates to photopolymerizable compositions suitable for the manufacture of printing plates.

It is known that photo-sensitive plates for printing plates are manufactured by hardening those ethylenically unsaturated compounds which become cross-linked and insolubilized under action of actinic rays in the presence of photo-sensitizers with the aid of water-soluble polymers. In hardening such compositions for printing plates at room temperature under action of actinic rays, addition polymerization of polymerizable double bonds in the compounds is always inhibited by oxygen in air. Consequently, it is necessary to replace oxygen in the photo-sensitive layer with an inert gas before use and the photo-sensitive plates prepared by coating with photopolymerizable compositions must be stored for a time in an atmosphere of inert gas. Moreover, the ethylenically unsaturated compounds are of low molecular weight, and if the thickness of the photo-sensitive layer of the compositions is 10 microns or less, such as in the case of lithographic plates, the low molecular weight compounds tend to evaporate off during storage of the printing plates. The range of usage is thus greatly restricted. In addition, ethylenically unsaturated compounds in liquid form are of low molecular weight and a large quantity of water-soluble polymers will be required to prepare a solid photo-sensitive layer from such compounds. It is thus necessary to provide means for increasing the double bonds in the ethylenically unsaturated compounds to increase the cross-linking density. As a result, a large volume diminition of the resin layer occurs after hardening as a result of increasing in the cross-linking density.

The present inventors have carried out extensive studies to correct the above-mentioned shortcomings of the known photopolymerizable compositions and completed this invention. This invention relates to photopolymerizable composition, and an object of this invention is to provide photopolymerizable compositions whose addition polymerization reaction is not inhibited by the oxygen in air thereby making it unnecessary to replace oxygen in the photo-sensitive layer with an inert gas. Another object of this invention is to provide photopolymerizable compositions which undergo substantially no shrinkage in volume when irradiated with actinic rays and hardened as a result of cross-linking. A still further object of this invention is to provide photopolymerizable compositions from which the ethylenically unsaturated compounds do not evaporate off even when the thickness of the photo-sensitive layer is small, such as in the case of lithographic plates.

This invention relates to photopolymerizable compositions suitable for the manufacture of printing plates and the like comprising: (1) 40to 80% by weight of an unsaturated acrylurethane resin prepared by reacting a diisocyanate monomer with the polyethylene or polypropylene glycols having a molecular weight of up to about 2,000 such that 0.8 to 1.2 moles of the diisocyanate monomer reacts with one stoichiometric equivalent of the hydroxyl groups, and then reacting said reaction product with a polymerizable acrylate ester of methacrylate ester having a hydroxyl group such that one stoichiometric equivalent of the free isocyanate groups remaining in said reaction product reacts with 0.9 to 1.2 of the stoichiometric equivalent of the hydroxyl groups, (2) 60 to 20% by weight of a polymer which is compatible with said unsaturated acrylurethane resin and is soluble in dilute aqueous alkali solutions or alcohols, and (3) a photo-sensitizer which is capable of hardening said unsaturated acrylurethane under irradiation of actinic rays.

The unsaturated acrylurethane resin in the method of this invention is obtained by partially reacting a diisocyanate monomer with a dihydric or polyhydric alcohol or with a polymerizable acrylate ester or methacrylate ester having a hydroxyl group, and then further reacting the free isocyanate groups remaining in said partially reacted reaction product with a polymerizable acrylate ester or methacrylate ester having a hydroxyl group. The reaction is carried out in a known manner. One ethylenically polymerizable double bond group in the acrylurethane resin thus obtained is present in every 350 units to 1,200 units of molecular weight. If at least one said double bond group is present in a low molecular weight with less than 350 units of molecular weight, the proportion of the urethane groups $$\left[ -NH\overset{O}{\overset{\|}{C}}O- \right]$$

in the resin increases, and the crystallinity of the resin is increased so that said resin is useless in this invention. Also, the hydrophilic ether linkage in the resin structure diminishes or disappears and the resin loses solubility in water. On the other hand, if one ethylenically polymerizable double bond group is present in a high molecular weight resin with more than 1,200 units of molecular weight, the concentration by mole of said resin decreases. As a result, the rate of hardening by irradiation drops markedly. Moreover, because of a low degree of cross-linking, the hardness of the hardened portion is not enough. Also, since a large number of hydrophilic ether linkages are present in the hardened portion and the hardened portion is swollen with water, the obtained resin is unsuitable in this invention.

Diisocyanate monomers to be used for the preparation of unsaturated acrylurethane resin include tolylene diisocyanate, xylylene diisocyanate, hexamethylene diisocyanate, diphenylmethane diisocyanate, 3,3'-bitolylene-4,4'-diisocyanate, 3,3'-dimethyl diphenylmethane-4,4'-diisocyanate, phenylene diisocyanate, 4,4'-diphenylether diisocyanate, hydrogenated 4,4'-diphenyl-methane diisocyanate, naphthalene diisocyanate, hydrogenated tolylene diisocyanate, and lysine diisocyanate.

As dihydric or polyhydric alcohols to be used for partial reaction with the diisocyanate monomers there can be mentioned polyethylene glycols and polypropylene glycols having a molecular weight of up to about 2,000 and the general formula:

$$HO-\left( \underset{\underset{R}{|}}{CH}-CH_2-O \right)_n-H$$

(wherein R represents hydrogen or a methyl group and $n$ is an integer from 3 to 45), particularly polyethylene glycols containing 8 to 10 hydrophilic ether groups. Polyethylene glycols containing at least 3 hydrophilic ether groups are hydrophilic and suitable for the preparation of the partially reacted products which are precursors of the unsaturated acrylurethane resin of this invention.

The polymerizable acrylate esters or methacrylate esters containing a hydroxyl group to be used for further reaction to acrylurethane resin are represented by the general formula:

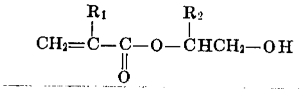

or

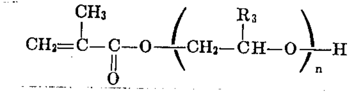

(wherein $R_1$, $R_2$, and $R_3$ are either hydrogen or a methyl group respectively and *n* is an integer from 2 to 10), representative examples of such compounds are 2-hydroxyethyl acrylate, 2-hydroxypropyl acrylate, 2-hydroxyethyl methacrylate, 2-hydroxypropyl methacrylate, polyethylene glycol monomethacrylates, and polypropylene glycol monomethacrylates.

In consideration of the manufacture and performance of printing plates, it is desirable that the partially reacted product to be used in this invention should be prepared by using a dihydric or polyhydric alcohol having a moleculr weight of up to about 2,000. If the molecular weight of such an alcohol exceeds about 2,000, the photo-reactivity of unsaturated acrylurethane resin drops and the air-drying property deteriorates. Moreover, when compatability of the unsaturated acrylurethane resin with other resins, solubility in water, and performance as printing plates are taken into account, the molecular weight of the alcohol used should preferably be from about 150 to about 1,000.

A dihydric or polyhydric alcohol with a molecular weight of up to about 2,000 is allowed to react with a diisocyanate monomer such that free isocyanate groups still remain in the molecules of a partially reacted product, that is, 0.8 to 1.2 moles of the diisocyanate monomer is made to react with one stoichiometric equivalent of the hydroxyl groups.

Complete reaction and reacted respectively of the partially product containing free isocyanate groups in the molecule with a polymerizable acrylate ester or methacrylate ester having a hydroxyl group to yield the unsaturated acrylurethane resin containing terminal vinyl groups is carried out by known methods. The acrylate ester or methacrylate ester mentioned above may be used in such methods, and the ratio of the two functional groups is chosen such that one stoichiometric equivalent of the isocyanate groups reacts with 0.9to 1.2 of the stoichiometric equivalent of the hydroxyl groups.

In accordance with this invention, when the amount of the unsaturated acrylurethane resin in the composition falls below 40% by weight, the proportions of ethylenically polymerizable double bonds become too small resulting in a lower photopolymerization velocity and lesser practicality. On the other hand, when the amount of the unsaturated acrylurethane resin in the composition exceeds 80% by weight, the composition becomes poorly soluble in dilute aqueous alkali solutions and furthermore the printing plates become viscous and damaged films result.

Any polymers, having a molecular weight of about 5,000 soluble in dilute aqueous alkali solutions or alcohols can be used in the compositions of this invention. Such polymers serve to maintain said compositions in an appearent solid state and make them readily soluble in dilute aqueous alkali solutions or alcohols. Examples of the polymers soluble in water or alcohols to be used in the compositions of this invention are: (1) half esters or their metal salts with a degree of substitution of 0.5 to 1.5 obtained by reacting one or more acid anhydrides or their metal salts selected from phthalic anhydride, succinic anhydride, maleic anhydride, tetrahydrophthalic anhydride, hexahydrophthalic anhydride, and trimellitic anhydride with a cellulose derivative, having a degree of substitution range of 0.8 to 1.9, selected from cellulose acetate, methyl-cellulose, ethylcellulose, hydroxyethylcellulose and hydroxypropylcellulose; (2) half esters obtained by reacting 30 to 70% of polyvinyl alcohol or partially saponified polyvinyl alcohol with one or more acid anhydrides selected from phthalic anhydride, succinic anhydride, maleic anhydride, tetrahydrophthalic anhydride, hexahydrophthalic anhydride, and trimellitic anhydride; (3) copolymers having a molecular weight of approximately 5,000 or more prepared by copolymerizing 15 to 40% by weight of acrylic acid or methacrylic acid with 60 to 85% by weight of one or more vinyl monomer selected from styrene, α-methyl styrene, α-chlorostyrene, β-bromostyrene, vinyl toluene, acrylate esters, methacrylate esters, vinyl acetate, acrylonitrile, and acrylamide; (4) half esters prepared by reacting 15 to 60% by weight of a copolymer said copolymer having a molecular weight of approximately 5,000 or more and being obtained by copolymerizing 20 to 80 % by weight of an acrylate ester expressed by the general formula:

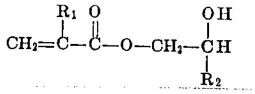

(wherein $R_1$ represents hydrogen or a methyl group and $R_2$ represents hydrogen or a methyl group) with 20 to 80% by weight of one or more vinyl monomers selected from styrene, α-methyl styrene, α-chlorostyrene, β-bromostyrene, vinyl toluene, acrylate esters, methacrylate esters, vinyl acetate, acrylonitrile, and acrylamide — with one or more acid anhydrides selected from phthalic anhydride, succinic anhydride, tetrahydrophthalic anhydride, hexahydrophthalic anhydride, and trimellitic anhydride; (5) alcohol-soluble nitrocelluloses; and (6) alcohol-soluble nylons (for example, nylon 6 — nylon 66 — nylon 610 copolymer nylon, and nylon 6 — nylon 66 — nylon 610 — nylon 12 copolymer nylon).

Any photo-sensitizers capable of hardening the unsaturated arcylurethane resin under the influence of actinic rays may be used in the compositions of this invention. In particular, those sensitizers which are stable toward heat are preferable. For example, the following compounds are satisfactory: benzoin and benzoin derivatives such as benzoin ethyl ether, benzoin methyl ether, and benzoin isopropyl ether; aromatic sulfonyl chlorides such as 1-naphthalene sulfonyl chloride and 2-naphthalene sulfonyl chloride; bicarbonyl compounds such as diacetyl and dibenzyl; and photoreducible dye compounds such as eosine, erythrosine and fluoroescein.

The photo-sensitizers are added in an amount of 0.001 to 5% by weight. When the amount added is less than 0.001% by weight, the effect of photo-sensitizer is not exhibited. On the other hand, even when the amount added exceeds 5% by weight, the photo-sensitizing effect is roughly the same as when about 5% by weight of sensitizer is added. Thus the addition of more than 5% is uneconomical. It is preferable to add from 0.5 to 2% by weight of sensitizer.

Actinic rays to irradiate and harden the compositions of this invention to manufacture printing plates must have the wave length in the range from 200to 500 mμ, preferably from 250 to 400 mμ, and sunlight, a chemical lamp, a mercury lamp, a carbon arc lamp, a xenon lamp, or a tungsten lamp is used as a source of such actinic rays. Upon irradiation of the compositions of this invention with actinic rays, the terminal vinyl groups in the unsaturated acrylurethane resin undergo addition polymerization. At the same time, the urethane group reacts with an oxygen molecule to form a hydroperoxide. Since the hydroperoxide is decomposed by irradiation of actinic rays to form free radicals which cause cross-linking, the hardening is not inhibited by the oxygen in air and the resin is completely hardened up to the surface. Consequently, the compositions of this invention are applicable to thin plates with a photo-sensitive layer of less than 10 μ such as in the case of lithographic plates. The effects to be realized in accordance with this invention are as follows.

1. The compositions of this invention are an appearent solid at room temperature and are applicable in the form of a photo-sensitive plate of a solid photo-sensitive layer.

2. The compositions of this invention possess excellent resistance to abrasion, resistance to solvents, and good adhesive property, do not swell under action of printing inks, and withstand printing pressure.

3. As the compositions of this invention contain a high molecular weight of unsaturated acrylurethane resins, the hardened resin layer by irradiation of actinic rays occurs with substantially no volume diminition.

4. In the cross-linking reaction of the compositions of this invention, addition polymerization of double bonds is not inhibited by oxygen in air.

5. The compositions of this invention, even when applied in a thin layer as the photo-sensitve layer of a base for lithographic plates, do not evaporate off during storage since high molecular weight of unsaturated acrylurethane resin are used.

6. With the compositions of this invention as the photo-sensitive layer of a printing plate, the developer to be used after exposure may be an aqueous alkaline solution and the developing time may be shortened.

This invention will be illustrated with reference to the examples. Part and percent in the following examples are by weight respectively.

EXAMPLE 1

To 360 parts (2.06 moles) of tolylene diisocyanate was added 400 parts (1.0 mole) of polyethylene glycol 400 (molecular weight) and the mixture was allowed to react at 140°C for 30 minutes and then cooled; 260 parts (2.0 moles) of 2 -hydroxyethyl methacrylate and 0.21 part of p-benzoquinone were added and the reaction was carried out at 40°C for 24 hours to yield an unsaturated acrylurethane resin (I) which is an extremely viscous liquid at normal temperature. A mixture prepared from 50 parts of I, 50 parts of of commercial cellulose acetate phthalate, 1 part of benzoin ethyl ether, and 100 parts of acetone was applied to a chemically treated aluminum plate to a thickness of 0.5 mm (dry film) by means of an applicator and allowed to dry at room temperature for one week in a dark room. A photographic negative was placed on the photo-sensitive plate thus obtained, exposed to a 400W mercury lamp at a distance of 35 cm for 8 minutes, and developed by removing the unexposed portion with a 1% aqueous solution of diethanolamine (hereinafter simply called developed) to yield a sharp, hard relief.

EXAMPLE 2

A mixture of 40 parts of I of Example 1, 60 parts of a 20:20:60 copolymer (A) of acrylic acid, n-butyl acrylate, and methyl methacrylate, 1 part of benzoin, and 100 parts of acetone was applied to a chemically treated aluminum plate to a thickness of 0.5 mm (dry film) by means of an applicator and allowed to dry at room temperature for 48 hours in a dark room to furnish a photo-sensitive plate. A photographic negative was placed in direct contact with this photo-sensitive plate, exposed to a 400 W mercury lamp at a distance of 35 cm for 10 minutes, and developed with a 1% aqueous solution of diethanolamine to yield a hard relief.

EXAMPLE 3 to 400 parts (2.12 moles) of xylylene diisocyanate was added 400 parts (1.0 mole) of polyethylene glycol 400 (molecular weight) at 140°C for 30 minutes and then cooled; 260 parts (2.0 moles) of 2-hydroxyethyl methacrylate and 0.23 part of p-benzoquinone were added and the reaction was carried out at 40°C for 12 hours to yield an unsaturated acrylurethane resin (II) which is an extremely viscous liquid at normal temperature. A mixture of 65 parts of II, 35 parts of commercial cellulose acetate phthalate, 1 part of benzoin, and 100 parts of acetone was applied to a polyester sheet to a thickness of 0.5 mm (dry film) by means of an applicator and allowed to dry at room temperature for 48 hours in a dark room to furnish a photo-sensitive plate. A photographic negative was placed in direct contact with this photo-sensitive plate, exposed to a 400 W mercury lamp at a distance of 35 cm for 3 minutes, and developed by a 1% aqueous solution of ammonia to yield a hard, flexible relief. The image area showed good adhesion to the polyester base.

EXAMPLE 4

A mixture of 65 parts of II of Example 3, 35 parts of commercial cellulose acetate phthalate, 1 part of benzoin ethyl ether, and 0.01 part of 2,6-di-tert-butyl-4-methylphenol, was blended thoroughly in rolls heated to 90°C for 30 minutes, pressed onto an aluminum plate with an 800-mesh sand grain texture to a thickness of 1 mm by means of a hydraulic press at a pressure of 30 kg/cm$^2$ at 90°C for 5 minutes to prepare a photo-sensitive plate. A photographic negative was placed in direct contact with the sensitive layer of this plate, exposed to a 400 W mercury lamp at a distance of 35 cm for 5 minutes, and developed by a 1% aqueous solution of diethanolamine to yield a flexible, adhesive relief. When this relief was used in the relief printing on a kraft paper by gravure printing ink, transfer of ink was excellent and good prints were obtained.

EXAMPLE 5

4,4'-Diphenylmethane diisocyanate (525 parts, 2.1 moles) was reacted with 400 parts (1.0 mole) of polyethylene glycol 400 (molecular weight) at 140°C for 30 minutes and the mixture was cooled; the reaction product was reacted with a mixture of 260 parts (2.0 moles) of 2-hydroxyethyl methacrylate, 0.24 part of p-benzoquinone, and 300 parts of acetone at 40°C for 24 hours to yield an unsaturated acrylurethane resin (III). A mixture of 62 parts of III, 38 parts of commercial cellulose acetate phthalate, 2 parts of benzoin ethyl ether, and 600 parts of methyl ethyl ketone was applied to a hydrophilic aluminum plate with a 1,000 -mesh sand grain texture by means of a No. 24 bar coater and dried at normal temperature for 30 minutes to give a photo-sensitive plate for lithography with a film thickness of 5 $\mu$. A photographic negative was placed in direct contact with this photo-sensitive plate, exposed to a 400 W mercury lamp at a distance of 35 cm for 4 minutes, developed with a 1% aqueous solution of diethanolamine for 30 to 60 seconds, washed with water, and dried. In this manner, the nonimage area was removed completely and the hardened image area gave an image with good oleophilicity.

EXAMPLE 6

A mixture of 50 parts of III of Example 5, 50 parts of copolymer A of Example 2, 2 parts of triethanolamine, 0.1 part of eosine, and 600parts of methyl ethyl ketone was treated in the same manner as in Example 5 to give a photo-sensitive plate for lithography. A photographic negative was placed in contact with this photo-sensitive plate, exposed to a 2 KW carbon arc lamp at a distance of 50 cm for 5 minutes, developed by a 1% aqueous solution of ammonia, washed with water, and dried to give an image with good oleophilicity.

EXAMPLE 7

A mixture of 80 parts of III of Example 5, 20 parts of cellulose acetate phthalate, 2 parts of benzoin, 1 part of eosine, and 600 parts of methyl ethyl ketone was treated in the same manner as in Example 6 to give a photo-sensitive plate for lithography. A photographic negative was placed in contact with this photo-sensitive plate, exposed to a 2 KW carbon arc lamp at a distance of 50 cm for 2 minutes, and developed by a 1% aqueous solution of diethanolamine. Development was extremely easy to carry out and a sharp-cut image was obtained.

EXAMPLE 8

To 400 parts (2.12 moles) of xylylene diisocyanate was added 150 parts of triethylene glycol and the mixture was allowed to react at 140°C for 30 minutes; 260 parts of 2-hydroxyethyl methacrylate and 0.25 part of 2,6-tert-butylcresol were added to the reaction product and the reaction was carried out at 80°C for 5 hours to yield an unsaturated acrylurethane resin in which the residual isocyanate groups showed an isocyanate value of 5.2. A mixture was prepared from 60 parts of this unsaturated acrylurethane resin, 40 parts of commercial cellulose acetate phthalate, 1 part of benzoin ethyl ether, and 70 parts of acetone. This mixture was applied to an epoxy-urea primer-coated tin plate to a thicknessof 0.5 mm (dry film), and after degreasing, dried in a hot air oven of 50°C for 24 hours to yield a photo-sensitive plate. A photographic negative was placed on this photo-sensitive plate, exposed to twenty 20 W chemical lamps (placed at intervals of 5 cm) at a distance of 5 cm for 2 minutes, and developed by a 0.02% aqueous solution of caustic soda to yield an extremely sharp, hard relief.

EXAMPLE 9

An acrylic copolymer composed of 50 parts of methyl methacrylate and 50 parts of 2-hydroxyethyl methacrylate was reacted with 30 parts of phthalic anhydride to yield a half ester (B) of the hydroxyl-containing acrylic copolymer and an acid anhydride. A mixture of 50 parts of III of Example 5, 50 parts of B, 2 parts of benzoin ethyl ether, 1 part of eosine, and 600 parts of methyl ethyl ketone was treated in the same manner as in Example 5 to give a photo-sensitive plate for lithography. Exposure was made for 3 minutes under the same conditions as in Example 7 followed by development with a 1% aqueous solution of ammonia. The development was extremely easy to carry out and a clear image was obtained

EXAMPLE 10

Glycerine (9.2 parts, 1 mole) was added to 54.0 parts (3.1 moles) of tolylene diisocyanate and the mixture was allowed to react at 60°C for 120minutes and then cooled; 124.5 parts (3 moles) of polypropylene glycol monomethacrylate was added and the reaction was carried out at 40°C for 24 hours to yield an unsaturated acrylurethane resin (V). A mixture of 50 parts of V, 50 parts of acrylic copolymer A of Example 2, 2 parts of benzoin ethyl ether, 0.5 part of eosine, 0.3 part of Crystal Violet, and 300 parts of methyl ethyl ketone was treated in the same manner as in Example 5 to yield a photo-sensitive plate for lithography. Exposure for 1 minute under the same conditions as in Example 7 followed by development with a 1% aqueous solution of diethanolamine gave a clear image.

EXAMPLE 11

To 400 parts (2.12 moles) of xylylene diisocyanate was added 200 parts (1.0 mole) of polypropylene glycol 200 (molecular weight) and the mixture was allowed to react at 140°C for 30 minutes and then cooled; 880 parts (2.0 moles) of polypropylene glycol monomethacrylate and 0.28 part of p-benzoquinone were added and the reaction was carried out at 40°C for 24 hours to yield an unsaturated acrylurethane resin (VI). A photo-sensitive plate for lighography was prepared in the same manner as in Example 7 except using VI in place of unsaturated acrylurethane resin III. Exposure for 4 minutes under the same conditions as in Example 7 followed by development with a 1% aqueous solution of ammonia yielded a clear image.

EXAMPLE 12

A mixture of 65 parts of unsaturated acrylurethane resin (II) of Example 3, 35 parts of cellulose acetate phthalate, 2 parts of benzoin ethyl ether, 1 part of eosine, and 600 parts of ethyl cellosolve was applied to a degreased zinc plate by a whirler at normal temperature and dried at 100°C for 5 minutes. The thickness of this photo-sensitive layer was 4 $\mu$. A photographic negative was placed in close contact with the foregoing photo-sensitive layer, exposed to a 400W mercury lamp at a distance of 35 cm for 3 minutes, developed by 1% ammonia water, washed with water, and dried at 100° to 110°C for 1 minute. The nonimage area was etched to a depth of 0.3 mm by a zinc etching solution and the film on the image area was swollen with acetone and scraped off to yield an extremely sharp-cut relief.

EXAMPLE 13

A mixture of 82 parts of unsaturated acrylurethane resin (II) obtained in Example 3, 35 parts of commercial cellulose acetate phthalate, 2 parts of benzoin ethyl ether, and 400 parts of ethyl cellosolve was applied at normal temperature to a degreased zinc plate by means of a whirler and dried. The thickness of the photosensitive layer thus prepared was 4 $\mu$. A photographic negative was placed in close contact with this photosensitve layer by suction, exposed to a 400W mercury lamp at a distance of 35 cm for 3 minutes, developed by a 1% aqueous solution of diethanolamine, washed with water, and dried at 100° to 110°C for 1 minute. The nonimage area was etched with a zinc etching solution and the image area was swollen with a 49:49:2 mixture of acetone, water, and diethanolamine and scraped off. An extremely sharp-cut relief was thus obtained by using the above composition as photo-resist.

EXAMPLE 14

To 400parts (2.12 moles) of xylylene diisocyanate was added 1,500parts (1.0 mole) of polyethylene glycol 1,500 (molecular weight) and the mixture was allowed to react at 140°C for 30 minutes; 260parts (2.0 moles) of 2-hydroxyethyl methacrylate and 0.25 part of 2,6-di-tert-butylcresol were added, and the reaction was carried out at 80°C for 5 hours to yield an unsaturated acrylurethane resin D in which the residual isocyanate groups showed an isocyanate value of 6.2. Fifty parts of unsaturated acrylurethane resin II in FIG. 3, 10 parts of unsaturated polyacrylurethane D, 40 parts of commercial cellulose acetate phthalate (passing 100 mesh), 5 parts of silica powder (trademark, Erosil), 1 part of benzoin ethyl ether, and 0.1 part of p-benzoquinone were mixed in a Blabenda blender at 80° to 105°C for 10 minutes and made into 0.5 mm-thick sheet by rubber rolls at 65°C. This sheet was pressed into an epoxy-urea primer-coaated tin plate at 100°C for 5 minutes at a pressure of 30kg/cm$^2$ by means of a hydraulic press. A photographic negative having letters was placed in direct contact with the photo-sensitive plate thus prepared, exposed to ten 20 W chemical lamps (placed at intervals of 5 cm) at a distance of 5 cm for 2 minutes by means of sprayer with a 0.02% aqueous solution of caustic soda to give a hard flexible relief (Shore hardness, 75). The image area showed good adhesion to the epoxy-urea primer-coated tin plate base.

Reference Example 1 (A case where one polymerizable ethylenic group is present in every 300units of molecular weight)

2-hydroxyethyl methacrylate (260 parts, 2.0 moles) was added dropwise to 360 parts (2.06 moles) of tolylene diisocyanate over 1 hour while maintaining the temperature at 40°C, and the reaction was continued thereafter at 40°C for 8 hours to yield white crystals of an unsaturated acylurethane resin. A mixture prepared from 50 parts of this unsaturated acrylurethane resin, 50 parts of commercial cellulose phthalate, 1 part of benzoin isopropyl ether, 0.05 part of 2,6-di-tert-butylcresol, and 100parts of acetone was applied to an epoxy-urea primer-coated tin plate to a thickness of 0.05 mm by means of a knife coater and dried in a hot air oven of 50°C for 24 hours to give a photo-sensitive plate. When this photo-sensitive plate was left standing at normal temperature for about a week in the dark, white crystals appeared on the surface of the photo-sensitive plate and they remained undissolved as spots when washed with a 0.5% aqueous solution of caustic soda.

Reference Example 2 (A case where one polymerizable ethylenic group is present in every 1,300 units of molecular weight)

To 400 parts (2.12 moles) of xylylene diisocyanate was added 2,000 parts (1.0 mole) of polyethylene glycol 2,000 (molecular weight) and the mixture was allowed to react at 140°C for 30 minutes and then cooled; 260 parts (2.0 moles) of 2-hydroxyethyl methacrylate and 0.23 part of p-benzoquinone were added and the reaction was carried out at 40°C for 24 hours to given an unsaturated acrylurethane resin which is white and crystaline at normal temperature. A mixture composed of 70 parts of this unsaturated acrylurethane resin, 35 parts of commercial cellulose acetate phthalate, 5 parts of silica powder (trademark, Erosil), 1 part of benzoin ethyl ether, and 100 parts of acetone was applied to an epoxy-urea primer-coated tin plate to a thickness of 0.5 mm by means of a knife coater and dried in a hot air oven of 50°C for 24 hours to give a photo-sensitive plate. A photographic negative having letters was placed in direct contact with this photo-sensitive plate, exposed to ten 20 W chemical lamps (placed at intervals of 5 cm) at a distance of 5 cm for 20 minutes, and developed by a 0.02% aqueous solution of caustic soda to yield a soft, flexible relief. The hardened portion of image was swollen with water and was not suitable for use in printing.

What is claimed is:

1. A photopolymerizable composition for printing plates comprising (1) 40 to 80% by weight of unsaturated acrylurethane resin prepared by reacting a diisocyanate monomer with a polyhydric alcohol having a molecular weight of up to about 2,000 such that 0.8 to 1.2 moles of the diisocyante monomer reacts with the stoichiometric equivalent of the hydroxyl groups, and then reacting said reaction product with a polymerizable acrylate ester or methacrylate ester having a hydroxyl group such that one stoichiometric equivalent of free isocyanate groups remaining in said reaction product reacts with 0.9 to 1.2 of the stoichiometric equivalent of the hydroxyl groups, (2) 60 to 20% by weight of a polymer which is compatible with said unsaturated acrylurethane resin and is soluble in dilute aqueous alkali solutions or alcohols, said polymer being selected from the group consisting of half esters or their metal salts obtained by reacting anhydrides of di- or tricarboxylic acids with cellulose derivative, half esters obtained by reacting polyvinyl alcohol or partially saponified polyvinyl alcohol with anhydrides, of di- or tricarboxylic acids, copolymers prepared by copolymerizing acrylic acid or methacrylic acid with vinyl monomers, half esters prepared by reacting copolymers containing 20 to 80% by weight of acrylate esters having hydroxyl group with vinyl monomers, alcohol-soluble nitrocellulose, and alcohol-soluble nylons and mixtures thereof, and (3) 0.001 to 5% by weight of a photo-sensitizer which is capable of hardening said unsaturated acrylurethane resin under irradiation of actinic rays.

2. Photopolymerizable compositions according to claim 1, wherein the diisocyanate monomer is selected from tolylene diisocyanate, xylylene diisocyanate, hexamethylene diisocyanate, diphenylmethane diisocyanate, 3,3'-bitolylene-4,4'-diisocyanate, 3,3'-dimethyldiphenylmethane-4,4'-diisocyanate, phenylene diisocyanate, 4,4'-diphenylether diisocyanate, hydrogenated 4,4'-diphenylmethane diisocyanate, naphthalene diisocyanate, hydrogenated tolylene diisocyanate, and lysine diisocyanate.

3. Photopolymerizable composition according to claim 1, wherein the polyhydric alcohol having a molecular weight of up to about 2,000 is at least one glycol selected from polyethylene glycols and polypropylene glycols of the formula:

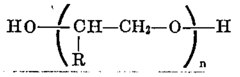

wherein R represents hydrogen or a methyl group and *n* is an integer from 3 to 45.

4. Photopolymerizable composition according to claim 1, wherein the photo-sensitizer is selected from benzoin and benzoin derivatives, aromatic sulfonyl chlorides, bicarbonyl compounds, and photo-redicible dye compound in an amount of 0.001 to 5.0% by weight.

5. Photopolymerizable composition according to claim 1, wherein the polymerizable acrylate ester or methacrylate ester having a hydroxyl group is at least one ester of the formula:

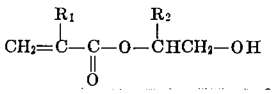

or

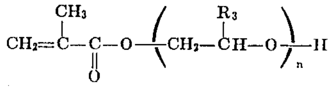

wherein $R_1$, $R_2$ and $R_3$ are either hydrogen or a methyl group respectively and *n* is an integer from 2 to 10.

6. Photopolymerizable composition according to claim 1 wherein said unsaturated acrylurethane resin is prepared by reacting diphenylmethane diisocyanate with polyethylene glycol having a molecular weight of 400 and then reacting the resulting reaction product with hydroxyethyl methacrylate and wherein said compatible polymer is a half ester of phthalic anhydride with cellulose acetate.

7. Photopolymerizable composition according to claim 1 wherein said unsaturated acrylurethane resin is prepared by reacting diphenylmethane diisocyanate with polyethylene glycol having a molecular weight of 400 and then reacting the resulting reaction product with hydroxyethyl methacrylate and wherein said compatible polymer is an interpolymer of acrylic acid, n-butyl acrylate and methyl methacrylate.

* * * * *